United States Patent
Ueno et al.

(10) Patent No.: US 8,400,237 B2
(45) Date of Patent: Mar. 19, 2013

(54) CIRCUIT DEVICE INCLUDING A NANO-COMPOSITE DIELECTRIC FILM

(75) Inventors: Hiroaki Ueno, Osaka (JP); Hiroyuki Sakai, Kyoto (JP); Tsuyoshi Tanaka, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 282 days.

(21) Appl. No.: 12/681,284

(22) PCT Filed: Jul. 29, 2008

(86) PCT No.: PCT/JP2008/002022
§ 371 (c)(1),
(2), (4) Date: Apr. 1, 2010

(87) PCT Pub. No.: WO2009/047876
PCT Pub. Date: Apr. 16, 2009

(65) Prior Publication Data
US 2010/0237967 A1    Sep. 23, 2010

(30) Foreign Application Priority Data

Oct. 9, 2007  (JP) ................................. 2007-263339

(51) Int. Cl.
*H01P 3/08* (2006.01)
(52) U.S. Cl. ....... 333/238; 333/24 C; 977/707; 977/712; 977/785
(58) Field of Classification Search .................. 333/238, 333/24 C; 977/701, 712, 723, 773, 785
See application file for complete search history.

(56) References Cited

U.S. PATENT DOCUMENTS

| | | | |
|---|---|---|---|
| 5,426,399 A * | 6/1995 | Matsubayashi et al. | 333/1 |
| 5,528,209 A | 6/1996 | Macdonald et al. | |
| 5,753,968 A * | 5/1998 | Bahl et al. | 257/664 |
| 6,016,087 A * | 1/2000 | Sasaki et al. | 333/116 |
| 6,768,400 B2 | 7/2004 | Tanabe | |
| 6,838,954 B2 | 1/2005 | Killen et al. | |
| 6,970,055 B2 * | 11/2005 | Toncich | 333/24 C |
| 2004/0124955 A1 * | 7/2004 | Wu et al. | 333/238 |
| 2006/0226415 A1 | 10/2006 | Nishijima et al. | |
| 2007/0188275 A1 * | 8/2007 | Wakabayashi et al. | 333/238 |
| 2007/0210883 A1 * | 9/2007 | Beer et al. | 333/246 |
| 2009/0195327 A1 * | 8/2009 | Cho et al. | 333/34 |

FOREIGN PATENT DOCUMENTS

| | | |
|---|---|---|
| JP | 9-17959 | 1/1997 |
| JP | 2000-183231 | 6/2000 |
| JP | 2002-141671 | 5/2002 |
| JP | 2002-141671 A | 5/2002 |
| JP | 2002-223077 A | 8/2002 |
| JP | 2003-332517 | 11/2003 |
| JP | 2006-033217 A | 2/2006 |

* cited by examiner

*Primary Examiner* — Benny Lee
(74) *Attorney, Agent, or Firm* — McDermott Will & Emery LLP (57) ABSTRACT

A circuit device includes a substrate 11, and a transmission line 10. The transmission line 10 includes a dielectric film 13 formed on the substrate 11, and a signal line formed on the dielectric film 13. The dielectric film 13 includes a nano-composite film in which particles of a first material are dispersed in a second material.

14 Claims, 7 Drawing Sheets

CIRCUIT DEVICE INCLUDING A NANO-COMPOSITE DIELECTRIC FILM

RELATED APPLICATIONS

This application is the U.S. National Phase under 35 U.S.C. §371 of International Application No. PCT/JP2008/002022, filed on Jul. 29, 2008, which in turn claims the benefit of Japanese Application No. 2007-263339, filed on Oct. 9, 2007, the disclosures of which Applications are incorporated by reference herein.

TECHNICAL FIELD

The present invention relates to circuit devices, and specifically to circuit devices such as circuit boards and monolithic microwave integrated circuits which include transmission lines.

BACKGROUND ART

With the development of communication devices such as mobile phones, increased attentions have been drawn to circuit devices configured to handle microwaves whose frequency ranging from several hundred megahertz to several gigahertz, and further millimeter waves whose frequency ranging from several tens of gigahertz to several hundred gigahertz. To handle signals in a band from the frequency range of the microwave to the frequency range of the millimeter wave, it is very important to reduce signal loss. For this reason, the circuit devices configured to handle the signals in the band from the frequency range of the microwave to the frequency range of the millimeter wave need low-loss transmission lines.

For example, monolithic microwave integrated circuits (MMICs) require transmission lines such as microstrip lines formed on a substrate on which semiconductor elements are provided. Such a microstrip line is configured such that a ground conductor serving as a ground plane faces a signal line with a dielectric film provided therebetween. For example, a semi-insulating substrate such as gallium arsenide (GaAs) is used as a dielectric, a signal line is formed on a principal surface of the substrate, and a back surface of the substrate is metallized to form a ground conductor, thereby forming a microstrip line. Alternatively, when a substrate is, for example, a silicon semiconductor, either benzocyclobutene (hereinafter referred to as BCB, relative dielectric constant 2.65) or polyimide (relative dielectric constant 3.3) which has a low relative dielectric constant is deposited on the substrate to have a thickness of several micrometers to several tens of micrometers, and the obtained film is used as a dielectric film, thereby forming a microstrip line (for example, see Patent Document 1).

Moreover, power amplifiers for a band of several hundred megahertz to several gigahertz used for, for example, base stations of mobile phones require internal matching circuits for transforming impedance in packages. Such an internal matching circuit generally includes a distributed constant circuit using a transmission line which uses, for example, a ceramic substrate having a signal line formed on its principal surface and a ground conductor formed on its back surface.

CITATION LIST

Patent Document
PATENT DOCUMENT 1: Japanese Patent Publication No. H09-17959

SUMMARY OF THE INVENTION

Technical Problem

However, such transmission lines involve the following problems. Characteristics of a transmission line are determined by various parameters. For example, the impedance of a microstrip line serving as a general transmission line is determined mainly by the relative dielectric constant and the thickness of a dielectric film, and the width of a signal line. Among the relative dielectric constant and the thickness of the dielectric film, and the width of the signal line, the relative dielectric constant of the dielectric film is determined according to the characteristics of a material of the dielectric film. Moreover, in addition to the relative dielectric constant, due to constraints of, for example, processibility, cost, and dielectric loss, choices of materials used for the dielectric film of the transmission line may be limited. This may significantly limit size parameters such as the thickness of the dielectric film, and the length and the width of the signal line of the microstrip line. Moreover, a similar problem arises in other types of transmission lines than the microstrip line. For this reason, circuit devices such as monolithic microwave integrated circuits (MMICs) requiring transmission lines suffer from considerable constraints on size.

Moreover, for an internal matching circuit or the like provided within a package of an RF power amplifier, endeavor has been made to ensure various ceramic substrates having different relative dielectric constants so that predetermined impedance and a predetermined line length are within a regulation size. However, it has been possible to obtain only ceramic substrates having a relative dielectric constant of about 10 to no more than about 100. Thus, when factors such as cost and the like are considered, there is almost no choice of materials.

It is an object of the present invention to provide a circuit device in which the above-discussed problem is solved, and which has a high degree of flexibility while alleviating the constraints on the transmission line.

Solution to the Problem

Specifically, a circuit device according to the present invention includes: a substrate; and a transmission line, wherein the transmission line includes a dielectric film formed on the substrate, and a signal line formed on the dielectric film, and the dielectric film includes a nano-composite film in which particles of a first material are dispersed in a second material.

According to the circuit device of the present invention, the dielectric film constituting the transmission line includes the nano-composite film in which the particles of the first material are dispersed in the second material. For this reason, it is possible to freely set the relative dielectric constant of the dielectric film. Therefore, the degree of flexibility of designing the transmission line is significantly improved. As a result, it becomes easier to design and manufacture circuit devices such as monolithic semiconductors, internal matching circuits, and the like.

In the circuit device of the present invention, the substrate may be a semiconductor.

The circuit device of the present invention may further include a circuit element formed on the substrate.

The circuit device of the present invention may operate as a monolithic microwave integrated circuit.

In the circuit device of the present invention, the dielectric film may include a plurality of films which are different in relative dielectric constant from each other.

In the circuit device of the present invention, the transmission line may be a coupling line including the signal line having two signal lines extending parallel to each other.

In the circuit device of the present invention, the nano-composite film may fill a region between the two signal lines extending parallel to each other.

The circuit device of the present invention may further include a capacitor, wherein the capacitor may include a lower electrode and an upper electrode facing each other with the nano-composite film provided therebetween.

In the circuit device of the present invention, the transmission line may include periodically formed first and second regions, and the first regions and the second regions are different in impedance from each other.

In the circuit device of the present invention, the dielectric film may include first films and second films which are different in relative dielectric constant from each other, the first films and the second films may be periodically formed correspondingly to the first regions and the second regions respectively, and the first films may be the nano-composite film.

In the circuit device of the present invention, the transmission line may include a first conductor and second conductors, the dielectric film may include a first film and a second film, the first film may be the nano-composite film formed on the second film, the first conductor may be formed between the second film and the substrate, the second conductors may be periodically formed between the first film and the second film correspondingly to second regions.

In the circuit device of the present invention, the first material preferably has a particle size of greater than or equal to 1 nm and less than or equal to 200 nm.

In the circuit device of the present invention, the first material may be ceramics. In this case, the ceramics may be strontium titanate or barium strontium titanate. Alternatively, the ceramics may be hafnium oxide, hafnium aluminate, or lead zirconate titanate.

In the circuit device of the present invention, the second material may be benzocyclobutene, polyimide, polytetrafluoroethylene, or polyphenylene oxide.

Advantages of the Invention

According to the circuit device of the present invention, it is possible to provide a circuit device in which the constraints on the transmission line is alleviated and which has a high degree of flexibility.

BRIEF DESCRIPTION OF THE DRAWINGS

[FIG. 1]

[FIG. 2]

[FIG. 3]

[FIG. 4]

[FIG. 5]

[FIG. 6]

[FIG. 7]

[FIG. 8]

[FIG. 9]

[FIG. 10]

[FIG. 11]

[FIG. 12]

[FIG. 13]

DESCRIPTION OF REFERENCE CHARACTERS

10 Transmission Line
11 Substrate
12 Ground Conductor
13 Dielectric Film
13A First Film
13B Second Film
14 Signal Line
21 Internal Matching Circuit
22 Transistor Chip
23 Package
24 Lead
30 MIM Capacitor
31 Lower Electrode
32 Upper Electrode
33 Nano-Composite Film
34 Insulator
40A First Region
40B Second Region
43 Dielectric Film
43A First Film
43B Second Film
50A First Region
50B Second Region
52A First Conductor
52B Second Conductor
53 Dielectric Film
53A First Film
53B Second Film

DETAILED DESCRIPTION OF PREFERRED EMBODIMENTS (Embodiment 1)

Figure 1:
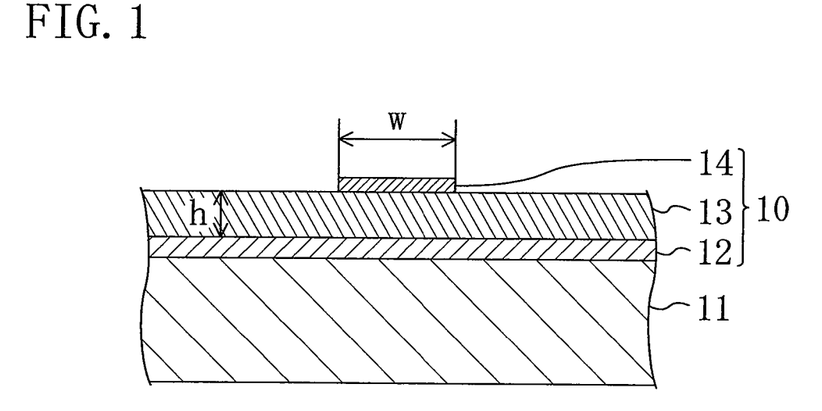
FIG. 1 is a cross-sectional view illustrating a circuit device according to Embodiment 1.

Embodiment 1 of the present invention will be described with reference to the drawings. FIG. 1 illustrates a cross-sectional configuration of a circuit device according to Embodiment 1. As shown in FIG. 1, the circuit device of the present embodiment includes a ground conductor 12 formed on a substrate 11, a dielectric film 13 made of a nano-composite film formed on the ground conductor 12, and a signal line 14 formed on the dielectric film 13. The ground conductor 12, the dielectric film 13, and the signal line 14 constitute a transmission line 10 serving as a microstrip line. The impedance of the microstrip line is determined according to mainly the width w of the signal line 14, the thickness h of the dielectric film 13, and the relative dielectric constant of the dielectric film 13. For this reason, when the dielectric film 13 is made of a benzocyclobutene (BCB) film having a relative dielectric constant of 2.65, the ratio between the width w and the thickness h needs to be about 3 in order to form a microstrip line having an impedance of 50Ω. Meanwhile, since the width w of the signal line 14 needs to be 30-40 μm considering the resistance loss of the line, the thickness of the dielectric film 13 needs to be 10-15 μm.

However, the circuit device of the present embodiment includes a nano-composite film as the dielectric film 13. The nano-composite film here is a film made of a material in which fine particles of a first material having a high relative dielectric constant are dispersed in a second material having a low relative dielectric constant and a low dielectric loss. In the present embodiment, an example in which strontium titanate (STO) is used as the first material, and BCB is used as the second material will be described. The relative dielectric constant of the nano-composite film can be controlled by the relative dielectric constant and the amount of the fine particles dispersed in the BCB film. Thus, the relative dielectric constant can be freely set to a value in the range from several tens to several thousands, which enables the thickness of the dielectric film 13 to be designed freely.

The relative dielectric constant of the dielectric film 13 also affects the wavelength of a wave propagating through the microstrip line. For this reason, the length of the microstrip line in the case of using the nano-composite film having a high dielectric constant can be shortened in comparison with the case of using the BCB film having a low dielectric constant.

Figure 2:
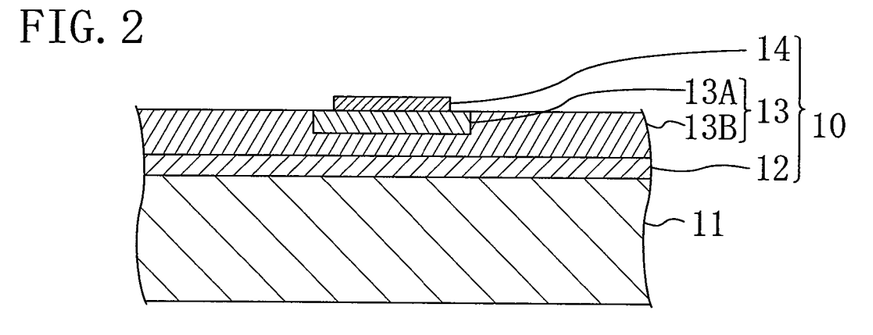
FIG. 2 is a cross-sectional view illustrating a variation of the circuit device of Embodiment 1.

Moreover, since the nano-composite film of the present embodiment includes the BCB film as a base, the nano-composite film can be easily formed by spin coating in the same manner as the BCB film. Therefore, ordinary manufacturing processes can be used without modification. Moreover, it is easy to form a layered film including a BCB film and a nano-composite film, and to form a layered film including nano-composite films having different relative dielectric constants. As described above, when the dielectric film 13 is made of a layered film, it is possible to further improve the degree of flexibility of the relative dielectric constant of the dielectric film 13. Alternatively, as shown in FIG. 2, part of an upper portion of the dielectric film 13 directly under the signal line 14 can be a first film 13A made of a nano-composite film, and the other portions can be a second film 13B made of a BCB film. In this case, the ground conductor 12, the first film 13A, the second film 13B and the signal line 14 constitute a transmission line 10 serving as a microstrip line.

In practice, a nano-composite film was formed by mixing STO and BTO with an acryl-based resin so that the content of the STO and BTO in the acryl-based resin was 20%. The relative dielectric constant of the formed nano-composite film was 10. By using the formed nano-composite film, a microstrip line was formed, and the characteristics of this microstrip line were compared with the characteristics of a microstrip line formed by using an ordinary BCB film. To reduce resistance loss, the width w (FIG. 1) of a signal line of the microstrip line using the BCB film and the width w (FIG. 1) of a signal line of the microstrip line using the nano-composite film were both set to 36.75 μm. Moreover, to achieve a characteristic impedance of 50Ω, the thickness of the BCB film was set to 15 μm, and the thickness of the nano-composite film was set to 42 μm. The wavelengths of signals propagating through both the microstrip lines were calculated. As a result, the wavelength of the microstrip line using the BCB film was 7.83 mm, whereas the wavelength of the microstrip line using the nano-composite film was 4.53 mm, i.e., was reduced to about 58%. This reveals that when STO and BTO as nano-composites are mixed with an acryl-based resin so that the content of the STO and BTO in the acryl-based resin is 20% or larger, the relative dielectric constant is 10 or larger, and the wavelength of the microstrip line using the nano-composite film can be shortened to 58% or less in comparison with the case of using the BCB film. Thus, the circuit device can be miniaturized.

In the circuit device illustrated in FIG. 1 or FIG. 2, the substrate 11 may be an insulating material such as gallium arsenide (GaAs), or may be a conducting material such as silicon (Si). Moreover, a circuit element such as a transistor may be formed on the substrate. In this case, between the substrate 11 and the ground conductor 12, an interconnect layer may be formed, where the interconnect layer includes an interlayer dielectric layer made of, for example, a silicon oxide ($SiO_2$), and a metal interconnect or the like. Alternatively, the ground conductor 12 may be a metal interconnect formed on a top layer of the interconnect layer.

Figure 3:
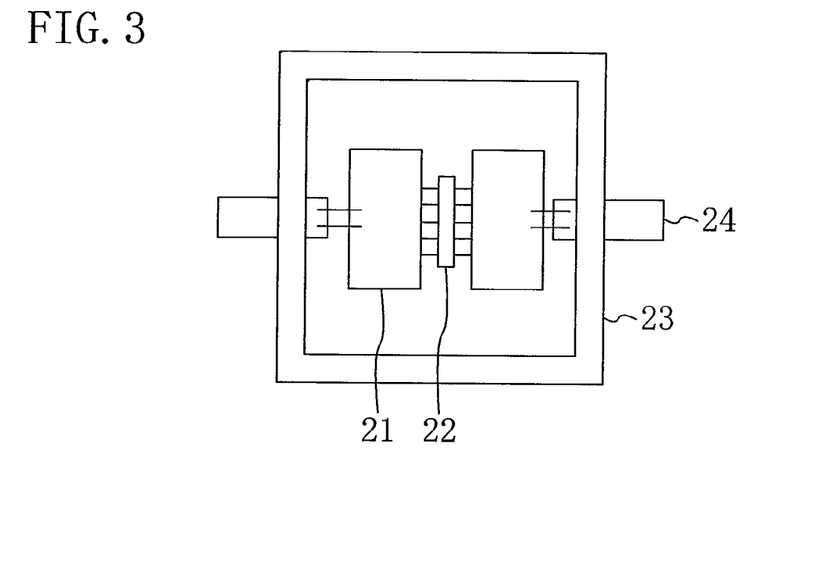
FIG. 3 is a plan view illustrating an example in which the circuit device according to Embodiment 1 is used as an internal matching circuit of an RF power amplifier.

Moreover, the circuit device illustrated in FIG. 1 or FIG. 2 may be used as an internal matching circuit 21 of, for example, an RF power amplifier of FIG. 3. In FIG. 3, a transistor chip 22 is connected to the internal matching circuit 21 serving as the circuit device of the present embodiment by wire bonding. The internal matching circuit 21 is connected to a lead 24 of a package 23 by wire bonding.

In a power amplifier for a band ranging from several hundred megahertz to several gigahertz used in, for example, base stations for mobile phones, the transistor chip 22 is a transistor having a relatively large size in order to output sufficient power. When the size of a transistor chip is increased, its input/output impedance is significantly reduced. Therefore, when an impedance matching circuit is formed outside the package, the loss of the matching circuit is non-negligible.

For this reason, it is necessary to provide the internal matching circuit 21 in the package to increase the input or output impedance at the outside of the package. Since the internal matching circuit 21 needs to be accommodated in the package, the size of the internal matching circuit 21 is limited. However, the size of the internal matching circuit 21 is determined according to the relative dielectric constant of the dielectric film 13.

When a circuit device of the present embodiment which has a nano-composite film used as the dielectric film 13 is used to the internal matching circuit, the relative dielectric constant of the dielectric film 13 can be freely set, so that the degree of flexibility of the size of the internal matching circuit 21 is significantly improved.

(Embodiment 2)

Figure 4:
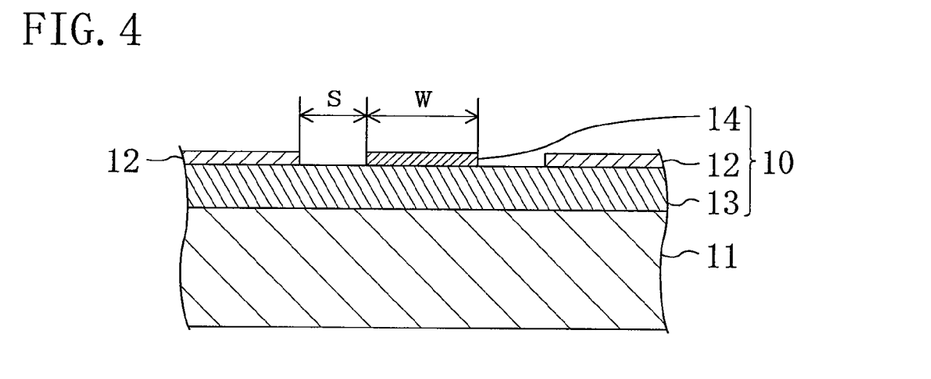
FIG. 4 is a cross-sectional view illustrating a circuit device according to Embodiment 2.

Embodiment 2 of the present invention will be described below with reference to the drawings. FIG. 4 illustrates a cross-sectional configuration of a circuit device according to Embodiment 2. In FIG. 4, the same reference symbols as those shown in FIG. 1 are used to represent equivalent elements, and the explanation thereof will be omitted.

As shown in FIG. 4, as a transmission line 10, the circuit device of the present embodiment includes a coplanar line instead of the microstrip line. For this reason, on a dielectric film 13, a signal line 14 and ground conductors 12 are formed. The signal line 14 is formed between the two ground conductors 12, and the signal line 14 extends parallel to the ground conductors 12.

The impedance of the coplanar line is determined according to the ratio between the signal line width w and the gap s between the signal line 14 and the ground conductor 12. Therefore, in order to increase the line width w, the gap s needs to be enlarged. However, when the gap s is enlarged, and the relative dielectric constant of the dielectric film 13 is small, the electric field from the signal line 14 to the ground conductor may pass through portions other than the dielectric film 13, for example, thorough the substrate 11. This causes no problem when the substrate 11 is insulative. However, this may cause a large signal loss, and may lower the impedance when the substrate 11 is conductive. This inevitably affect also the case where an interconnect layer and the like is provided between the substrate 11 and the dielectric film 13. To avoid this, the thickness of the dielectric film 13 needs to be increased.

However, the circuit device of the present embodiment includes a nano-composite film having a high relative dielectric constant as the dielectric film 13. For this reason, the relative dielectric constant of the dielectric film 13 can be freely selected, which allows the thickness of the dielectric film 13 to be designed freely.

The relative dielectric constant of the dielectric film 13 also affects the wavelength of a wave propagating through the coplanar line. For this reason, the length of the coplanar line in the case of using the nano-composite film having a high dielectric constant can be shortened in comparison with the case of using the BCB film having a low dielectric constant.

Moreover, since the nano-composite film of the present embodiment also includes the BCB film as a base, the nano-composite film can be easily formed by spin coating in the same manner as the BCB film. Therefore, ordinary manufacturing processes can be used without modification. Moreover, it is easy to form a layered film including a BCB film and a nano-composite film, and to form a layered film including nano-composite films having different relative dielectric constants. When the dielectric film 13 is made of a layered film, it is possible to further improve the degree of flexibility of the relative dielectric constant of the dielectric film 13.

Figure 5:
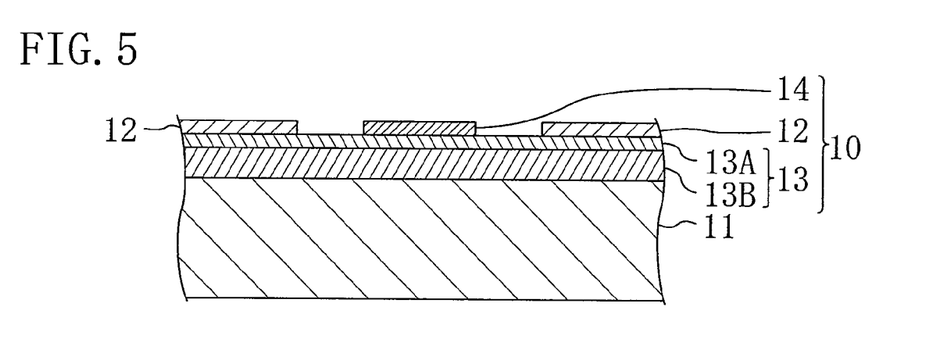
FIG. 5 is a cross-sectional view illustrating a variation of the circuit device according to Embodiment 2.

In the present embodiment, as shown in FIG. 5, the dielectric film 13 may be a layered film including a first film 13A made of a nano-composite film formed on the substrate 11, and a second film 13B made of a BCB film formed on the substrate 11. Alternatively, a layered film including nano-composite films having different relative dielectric constants may be formed. The signal line 14 and the ground conductors 12 are formed on the dielectric film 13. In this case, the ground conductor 12, the first film 13A, the second film 13B and the signal line 14 constitute a transmission line 10.

Figure 6:
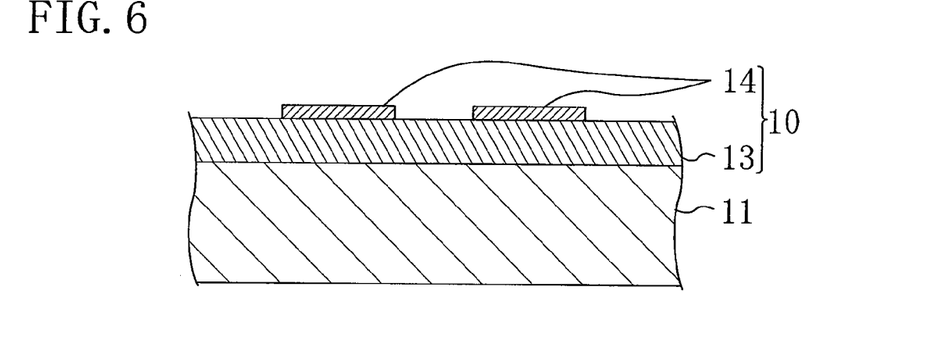
FIG. 6 is a cross-sectional view illustrating a variation of the circuit device according to Embodiment 2.
Figure 7:
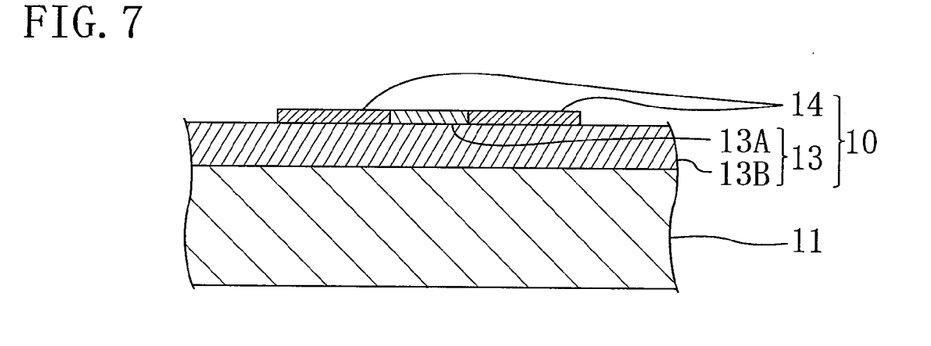
FIG. 7 is a cross-sectional view illustrating a variation of the circuit device according to Embodiment 2.

Moreover, alternative to the coplanar line, a coupling line in which a plurality of signal lines 14 extending parallel to each other as shown in FIG. 6 may be possible. The signal lines 14 and the dielectric film 13 are formed on the substrate 11. In this case, the dielectric film 13 and the signal lines 14 constitute a transmission line 10. To increase the degree of coupling of the coupling line, the relative dielectric constant of a space between the signal lines 14 may be increased. For this purpose, as shown in FIG. 7, the signal lines 14 are formed on a second film 13B made of a BCB film, and a first film 13A made of a nano-composite film may be formed between the signal lines 14. Note that the second film 13B may be a BCB film or may be a nano-composite film. The first film 13A and the second film 13B constitute the dielectric film 13. In this case, the dielectric film 13 and the signal lines 14 constitute a transmission line 10 disposed on substrate 11.

The circuit device of the present embodiment can be used as an MMIC or an internal matching circuit in the same manner as the circuit device of Embodiment 1.

(Embodiment 3)

Figure 8:
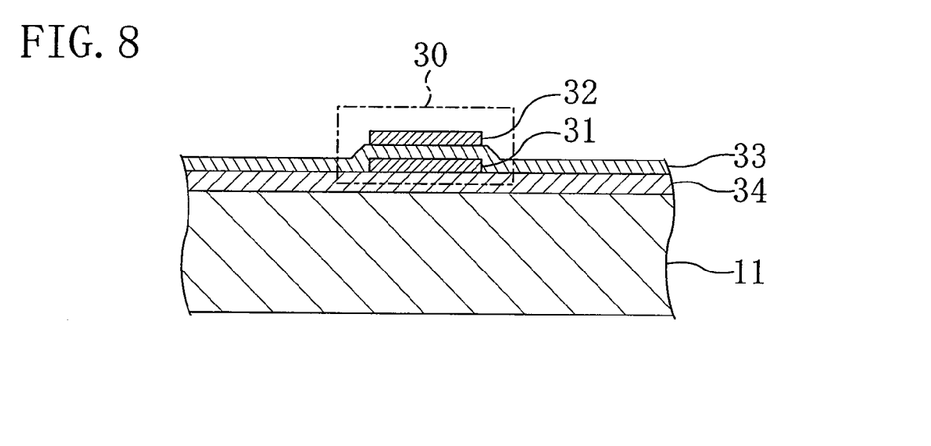
FIG. 8 is a cross-sectional view illustrating a circuit device according to Embodiment 3.

Embodiment 3 of the present invention will be described below with reference to the drawings. FIG. 8 illustrates a cross-sectional configuration of a circuit device according to Embodiment 3. In FIG. 8, the same reference symbols as those shown in FIG. 1 are used to represent equivalent elements, and the explanation thereof will be omitted.

As shown in FIG. 8, a circuit device of the present embodiment includes a metal-insulator-metal (MIM) capacitor 30 formed on an insulator 34 on a substrate 11. The MIM capacitor 30 includes a nano-composite film 33 formed over the substrate 11, and a lower electrode 31 and an upper electrode 32 facing each other with the nano-composite film 33 provided therebetween.

Circuit devices such as MMICs often require a capacitor. When a nano-composite film having a high relative dielectric constant is used as a capacitive insulator of the capacitor as in the present embodiment, it is possible to achieve a high capacitance value even with the thickness of the capacitive insulator being increased.

The nano-composite film of the transmission line illustrated in Embodiment 1 and Embodiment 2 and the nano-composite film of the MIM capacitor of the present embodiment may be made of the same film. Moreover, the insulator 34 may be provided as necessary. When a dielectric film made of a layered film including a BCB film and a nano-composite film is used, the insulator 34 may be a BCB film.

(Embodiment 4)

Figure 9:
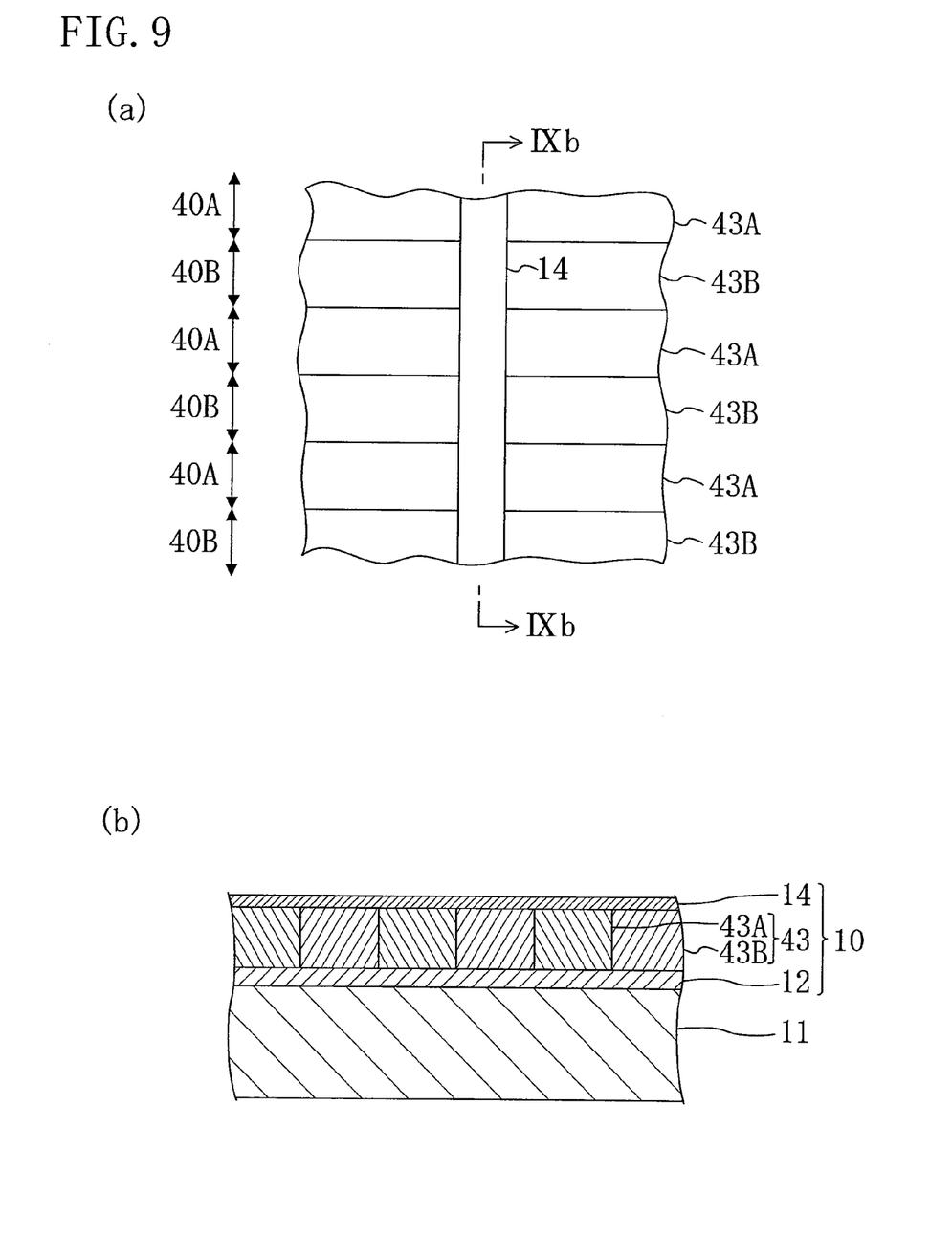
FIG. 9A is a plan view illustrating a circuit device according to Embodiment 4.
FIG. 9B is a cross-sectional view of the circuit device taken along the line IXb-IXb of FIG. 9A.

Embodiment 4 of the present invention will be described below with reference to the drawings. FIG. 9A illustrates a configuration of a circuit device according to Embodiment 4 in plan view. FIG. 9B illustrates a cross-sectional configuration of the circuit device along the line IXb-IXb of FIG. 9A.

As shown in FIG. 9B, the circuit device of Embodiment 4 includes a ground conductor 12 formed on a substrate 11, a dielectric film 43 formed on the ground conductor 12, and a signal line 14 formed on the dielectric film 43. The ground conductor 12, the dielectric film 43, and the signal line 14 constitute a transmission line 10 serving as a microstrip line. The dielectric film 43 of the present embodiment includes first films 43A and second films 43B which are formed in a stripe pattern. The first films 43A and the second films 43B extend in a direction crossing the signal line 14.

The first films 43A are made of a nano-composite film, and the second films 43B are made of a BCB film. For this reason, as shown in FIG. 9A, first regions 40A of the dielectric film 43 in which the first films 43A are formed are higher in relative dielectric constant than second regions 40B in which the second films 43B are formed. Therefore, the transmission line 10 serving as the microstrip line including the ground conductor 12, the dielectric film 43, and the signal line 14 has a high impedance in the first regions 40A and a low impedance in the second regions 40B. This causes a slow-wave phenomenon.

Figure 10:
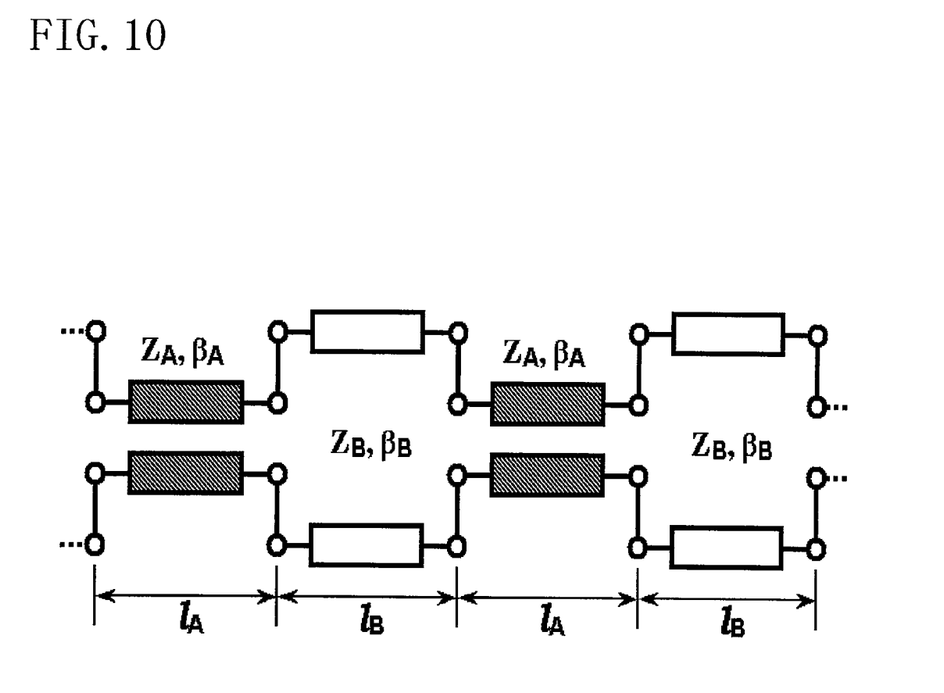
FIG. 10 is a circuit diagram illustrating the configuration of the circuit device according to Embodiment 4 focusing on its impedance.

The slow-wave phenomenon will be described below. FIG. 10 illustrates a configuration of a circuit device according to Embodiment 4 focusing on the impedance of each of the first region 40A and the second region 40B. Here, reference symbol $Z_A$ denotes the impedance of the first regions, reference symbol $Z_B$ denotes the impedance of the second regions, reference symbol $\beta_A$ denotes the phase constant of the first regions, reference symbol $\beta_B$ denotes the phase constant of the second regions, reference symbol $1_A$ denotes the length of the first regions, and reference symbol $1_B$ denotes the length of the second regions. Now, if a cycle $(1_A+1_B)$ is sufficiently shorter than the wavelength, and $Z_B$ is sufficiently smaller than $Z_A$, a slow-wave phenomenon occurs in which most of the energy of the electric field is stored in the second regions 40B, and most of the energy of the magnetic field is stored in the first regions 40A.

Using a propagation constant γ, Equation (1) as a general dispersion equation is obtained, and further, Equation (2) for the characteristic impedance is obtained, where $\gamma=\alpha+j\beta$, $\gamma A=\alpha_A+j\beta_A$, and $\gamma_B=\alpha_B+j\beta_B$.

[Equation 1]

$$\cosh(\gamma l) = \cosh(\gamma_A l_A)\cosh(\gamma_B l_B) + \frac{1}{2}\left(\frac{Z_A}{Z_B} + \frac{Z_B}{Z_A}\right)\sinh(\gamma_A l_A)\sinh(\gamma_B l_B) \quad \text{Equation (1)}$$

[Equation 2]

$$Z = \frac{\sqrt{Z_A \sinh(\gamma_A l_A)\cos(\gamma_B l_B) + Z_B \cosh(\gamma_A l_A)\sinh(\gamma_B l_B)}}{\sqrt{\frac{1}{Z_A}\sinh(\gamma_A l_A)\cos(\gamma_B l_B) + \frac{1}{Z_B}\cosh(\gamma_A l_A)\sinh(\gamma_B l_B)}} \quad \text{Equation (2)}$$

Figure 11:
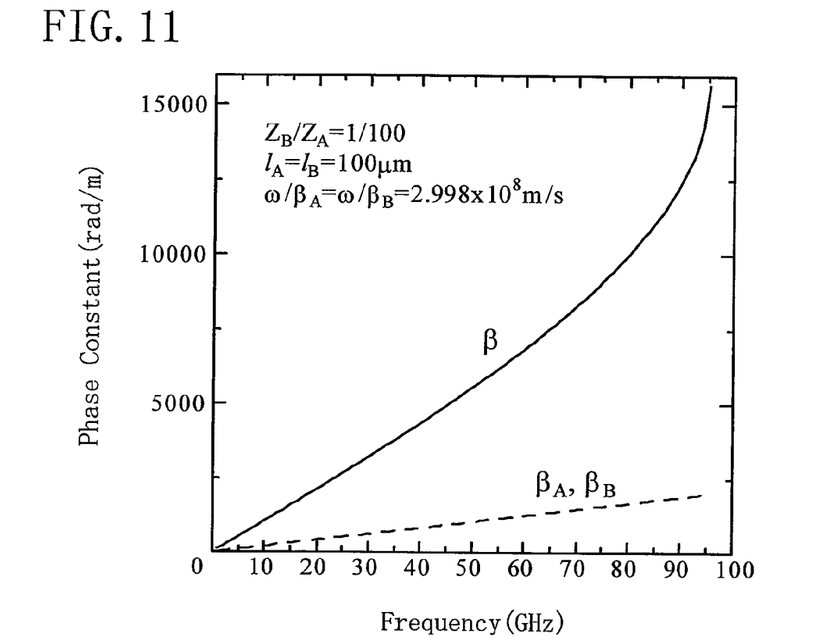
FIG. 11 is a graph illustrating the result of calculation of the relationship between the phase constant and the frequency.

FIG. 11 illustrates an example of the phase constant in rad/m vs. Frequency in GHz of the transmission line of FIG. 10 obtained by a numerical calculation using Equation (2). Note that for simplification purpose, the condition that $1_A=1_B$, $\beta_A=\beta_B$, and the ratio between $Z_A$ and $Z_B$ is 100:1 is provided for the calculation. In this example, $1_A$ and $1_B$ are equal to 100 μm, and $\omega/\beta_A$ and $\omega/\beta_B$ are equal to $2.998\times10^8$ m/s, as shown in FIG. 11.

As shown in FIG. 11, the phase constant β of the entirety of the line is larger than the phase constant $\beta_A$ of the first regions 40A and the phase constant $\beta_B$ of the second regions. This shows that the phase velocity of a wave decreases, that is, a slow-wave phenomenon occurs. The amount of the decrease of the velocity is generally expressed by a slow-wave factor ($\beta/\beta_0$) which is the ratio between the phase constant and the phase constant $\beta_0$ in vacuum. The slow-wave phenomenon means that the wavelength is shortened by a length multiplied by the slow-wave factor, and it is expected that a circuit using a distributed constant line can be downsized by utilizing the slow-wave phenomenon.

Figure 12:
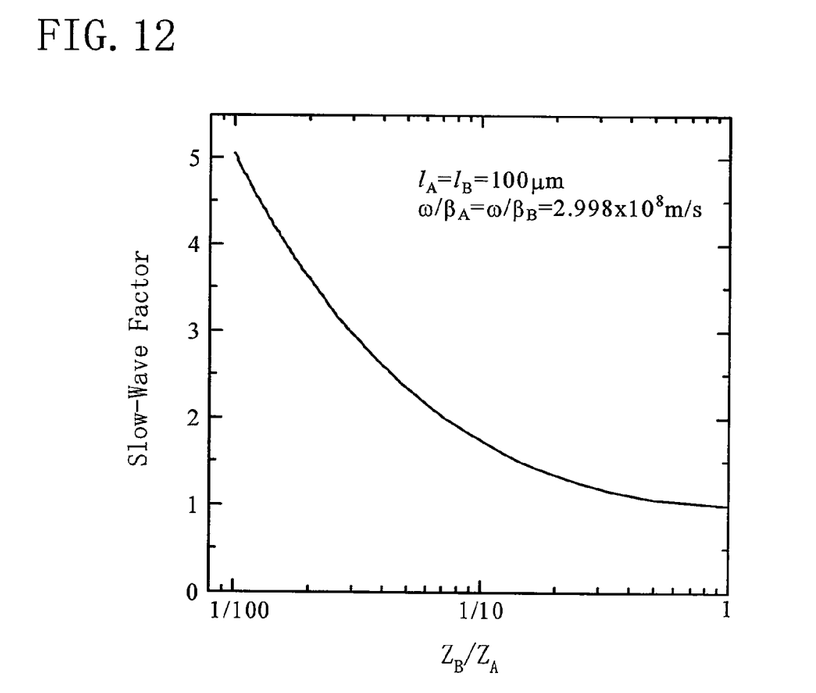
FIG. 12 is a graph illustrating the result of calculation of the relationship between the slow-wave factor and the impedance.

The slow-wave factor representing the rate of wavelength shortening strongly depends on an impedance ratio ($Z_B/Z_A$). FIG. 12 illustrates the result of calculation of the dependence of the slow-wave factor on the impedance $Z_B/Z_A$. In this calculation, $1_A$ and $1_B$ are equal to 100 μm, and $\omega/\beta_A$ and $\omega/\beta_B$ are equal to $2.998\times10^8$ m/s, as shown in FIG. 12. To enhance the effect of wavelength shortening by the slow-wave phenomenon, the impedance ratio needs to be increased. For example, in the case of FIG. 12, to shorten the wavelength to ½, a ratio between $Z_A$ $Z_B$ should be approximately 15.

The impedance of the microstrip line is proportional to the reciprocal of the square root of the relative dielectric constant of the dielectric film. Therefore, to achieve a ratio of 15 between $Z_A$ and $Z_B$, the relative dielectric constant of the first films needs to be about 200 times as large as that of the second films. It has been ordinary very difficult to form such a structure. However, as in the present embodiment, when a nano-composite film having a BCB film as a base and a BCB film are used, it is possible to easily form a dielectric film having alternately and periodically arranged two types of regions one of which has a relative dielectric constant about 200 times as large as that of the other type.

Note that similar advantages can be achieved also in a transmission line as a coplanar line, a differential line, a slot line, a coupling line, or the like as an alternative to the microstrip line.

The circuit device of the present embodiment can be used as an MMIC and an internal matching circuit in the same manner as the circuit device of Embodiment 1.

(Embodiment 5)

Figure 13:
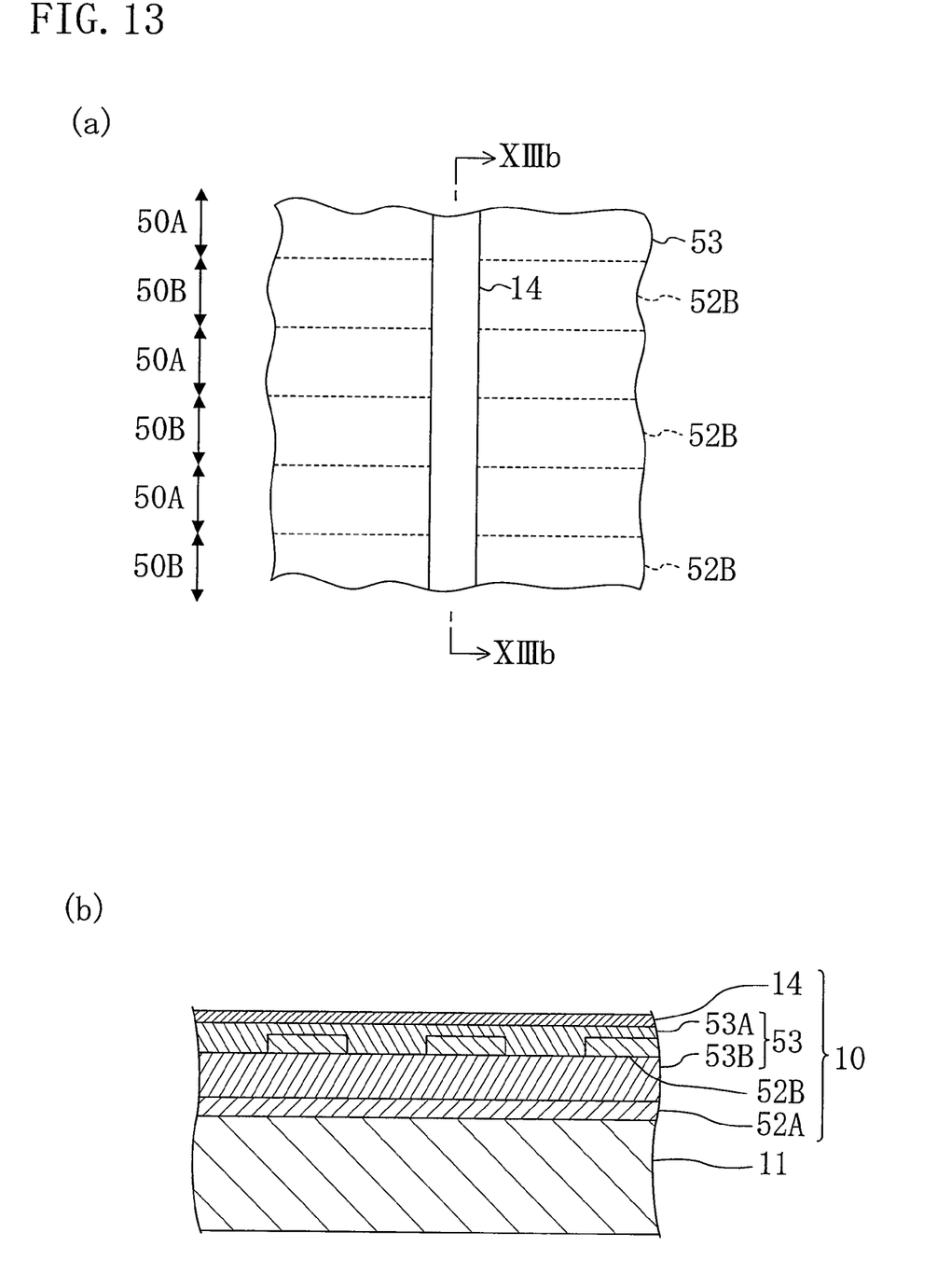
FIG. 13A is a plan view illustrating a circuit device according to Embodiment 5.
FIG. 13B is a cross-sectional view of the circuit device taken along the line XIII-XIII of FIG. 13A.

Embodiment 5 of the present invention will be described below with reference to the drawings. FIG. 13A illustrates a configuration of a circuit device according to Embodiment 5 in plan view. FIG. 13B illustrates a cross-sectional configuration of the circuit device taken along the line XIIIb-XIIIb of FIG. 13A.

As shown in both FIGS. 13(a) and 13(b), the circuit device of Embodiment 5 includes a dielectric film 53 formed on a substrate 11. The dielectric film 53 is a layered film in which a first film 53A made of a nano-composite film is formed on a second film 53B made of a BCB film. Between the dielectric film 53 and the substrate 11, a first conductor 52A is formed. Between the first film 53A and the second film 53B, second conductors 52B extending parallel to each other with a space therebetween are formed. Over the second film 53B, a signal line 14 extending in a direction crossing a direction in which the second conductors 52B extend is formed.

As shown in both FIGS. 13(a) and 13(b), the signal line 14, the first conductor 52A (FIG. 13(b)), the second conductors 52B, and the dielectric film 53 constitute a transmission line 10 (FIG.13(b)) serving as a microstrip line. In first regions 50A, the first conductor 52A serves as a ground conductor (ground plane). As shown in FIG. 13(a), in second regions 50B, the second conductors 52B serve as ground conductors (ground planes). Therefore, the distance between the signal line 14 and the ground conductors is shorter in the second regions 50B than in the first regions 50A. For this reason, the impedance of the microstrip line is lower in the second regions 50B in which the second conductors 52B are formed than in the first regions 50A in which the second conductors 52B are not formed. Thus, the regions having different characteristic impedances are alternatively and periodically provided, causing a slow-wave phenomenon as in Embodiment 4.

In particular, the present embodiment includes a nano-composite film having a high relative dielectric constant as the first film 53A. For this reason, the difference of the relative dielectric constant between the first regions 50A and the second regions 50B is large, and thus the difference of the impedance between the first regions 50A and the second regions 50B is also large. Thus, it is possible to enhance the effect of wavelength shortening by the slow-wave phenomenon.

The present embodiment can be applied also to a transmission line as a coplanar line, a differential line, a slot line, a coupling line, or the like as an alternative to the microstrip line.

The circuit device of the present embodiment can be used as an MMIC and an internal matching circuit in the same manner as the circuit device of Embodiment 1.

In the embodiments, STO has been used as the first material used for the nano-composite film, but any material may be possible as long as it has a high relative dielectric constant and can be processed into fine particles. For example, barium strontium titanate (BST), barium titanate (BTO), or the like can be used. Alternatively, ceramics having a relative dielectric constant of about several tens to about several thousands can be used. For example, hafnium oxide ($HfO_2$), hafnium aluminate ($HfAlO_x$), lead zirconate titanate (PZT), or the like can be used. Alternatively, a plurality of materials having different relative dielectric constants may be used.

For the particle size of the first material, it is required only that the first material can be kneaded with and dispersed in the second material, and the smaller the particle size is, the more preferable it is. Specifically, the particle size is preferably 1

μm or smaller, and when the particle size is in the range of about 1-200 nm, it is possible to obtain particularly preferable characteristics.

Moreover, the concentration of the first material may be selected according to the necessary relative dielectric constant, and the concentration of, for example, the combination of STO and BCB can be increased to about 90%.

The second material can be any material as long as it has a low relative dielectric constant and low dielectric loss. As the second material, it is possible to use polyimide, tetrafluoroethylene, polyphenylene oxide, or the like instead of BCB.

Although an MMIC and an internal matching substrate have been taken as examples of the circuit device, similar advantages can be achieved in, for example, a substrate on which a package is mounted and an interposer connecting a chip with a substrate as long as they are circuit devices using a transmission line such as a microstrip line, a coplanar line, or the like.

INDUSTRIAL APPLICABILITY

The circuit device according to the present invention can realize a circuit device alleviating the constraints on a transmission line and having a high degree of flexibility. The circuit device according to the present invention is useful as, for example, a circuit device such as in particular, a circuit board including a transmission line, a monolithic microwave integrated circuit, and the like.

The invention claimed is:

1. A circuit device comprising:
a substrate; and
a transmission line, wherein:
the transmission line includes a dielectric film formed on the substrate, and a signal line formed on the dielectric film,
the dielectric film includes a nano-composite film in which particles of a first material are dispersed in a second material,
the transmission line includes periodically formed first and second regions, in plan view,
the first regions and the second regions are different in impedance from each other,
the transmission line includes a first conductor and second conductors,
the dielectric film includes a first film and a second film,
the first film is the nano-composite film formed on the second film,
the first conductor is formed between the second film and the substrate, and
the second conductors are periodically formed between the first film and the second film, so that each of the second regions includes a corresponding one of the second conductors and the first regions do not include any of the second conductors.

2. A circuit device comprising:
a substrate; and
a transmission line, wherein:
the transmission line includes a dielectric film formed on the substrate, and a signal line formed on the dielectric film,
the dielectric film includes a nano-composite film in which particles of a first material are dispersed in a second material,
the first material has a particle size of greater than or equal to 1 nm and less than or equal to 200 nm, and
the first material is a ceramic.

3. The circuit device of claim 2, wherein the ceramic is hafnium oxide, hafnium aluminate, or lead zirconate titanate.

4. The circuit device of claim 2, wherein the ceramic is strontium titanate or barium strontium titanate.

5. A circuit device comprising:
a substrate; and
a transmission line, wherein:
the transmission line includes a dielectric film formed on the substrate, and a signal line formed on the dielectric film,
the dielectric film includes a nano-composite film in which particles of a first material are dispersed in a second material, and
the dielectric film includes a plurality of films which are different in relative dielectric constant from each other.

6. The circuit device of claim 5, wherein the transmission line is a coupling line including the signal line having two signal lines extending parallel to each other.

7. The circuit device of claim 6, wherein the nano-composite film fills a region between the two signal lines extending parallel to each other.

8. The circuit device of claim 5, further comprising:
a capacitor, wherein
the capacitor includes a lower electrode and an upper electrode facing each other with the nano-composite film provided therebetween.

9. The circuit device of claim 5, wherein
the transmission line includes periodically formed first and second regions, and
the first regions and the second regions are different in impedance from each other.

10. The circuit device of claim 5, wherein:
the transmission line includes periodically formed first and second regions,
the first regions and the second regions are different in impedance from each other,
the plurality of films of the dielectric film include first films and second films which are different in relative dielectric constant from each other,
the first films and the second films are periodically formed correspondingly to the first regions and the second regions respectively, and
the first films are the nano-composite film.

11. The circuit device of claim 5, wherein the first material has a particle size of greater than or equal to 1 nm and less than or equal to 200 nm.

12. The circuit device of claim 5, wherein the substrate is made of a semiconductor.

13. The circuit device of claim 12, further comprising a circuit element formed on the substrate.

14. The circuit device of claim 13, operating as a monolithic microwave integrated circuit.

* * * * *